(12) United States Patent
Wang et al.

(10) Patent No.: US 10,103,150 B1
(45) Date of Patent: Oct. 16, 2018

(54) SEMICONDUCTOR DEVICE HAVING INSULATING LAYER HIGHER THAN A TOP SURFACE OF THE SUBSTRATE, AND METHOD FOR REDUCING THE DIFFICULTY OF FILLING AN INSULATING LAYER IN A RECESS

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Ying-Chiao Wang, Changhua County (TW); Yu-Cheng Tung, Kaohsiung (TW); Li-Wei Feng, Kaohsiung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/585,180

(22) Filed: May 3, 2017

(30) Foreign Application Priority Data

Apr. 5, 2017 (CN) .......................... 2017 1 0217035

(51) Int. Cl.
*H01L 27/108* (2006.01)
*H01L 23/528* (2006.01)

(52) U.S. Cl.
CPC .... *H01L 27/10811* (2013.01); *H01L 23/5283* (2013.01); *H01L 27/10823* (2013.01); *H01L 27/10894* (2013.01); *H01L 27/10897* (2013.01)

(58) Field of Classification Search
CPC ......... H01L 27/10811; H01L 27/10823; H01L 23/5283; H01L 27/10897; H01L 27/10894; H01L 27/108; H01L 23/528
See application file for complete search history.

(56) References Cited

U.S. PATENT DOCUMENTS

| | | | |
|---|---|---|---|
| 9,431,324 B2 | 8/2016 | Shin | |
| 2011/0244640 A1* | 10/2011 | Lin | H01L 21/28273 438/261 |
| 2015/0104934 A1 | 4/2015 | Kim | |
| 2015/0255464 A1 | 9/2015 | Lee | |
| 2016/0163858 A1 | 6/2016 | Kim | |
| 2016/0181107 A1 | 6/2016 | Shin | |
| 2016/0181143 A1* | 6/2016 | Kwon | H01L 27/1052 438/586 |

* cited by examiner

*Primary Examiner* — Steven Loke
*Assistant Examiner* — Juanita Rhodes
(74) *Attorney, Agent, or Firm* — Winston Hsu

(57) ABSTRACT

The present invention provides a semiconductor structure including a substrate defining a memory cell region and a peripheral region, a periphery gate stacking structure located within the peripheral region, wherein the periphery gate stacking structure includes at least a first gate layer, and a second gate layer disposed on the first gate layer. The semiconductor structure further includes a cell stacking structure located within the memory cell region, the cell stacking structure having at least a first insulating layer partially disposed in the substrate, a top surface of the first insulating layer being higher than a top surface of the substrate, and the top surface of the first insulating layer and a top surface of the first gate layer being on a same level.

20 Claims, 7 Drawing Sheets

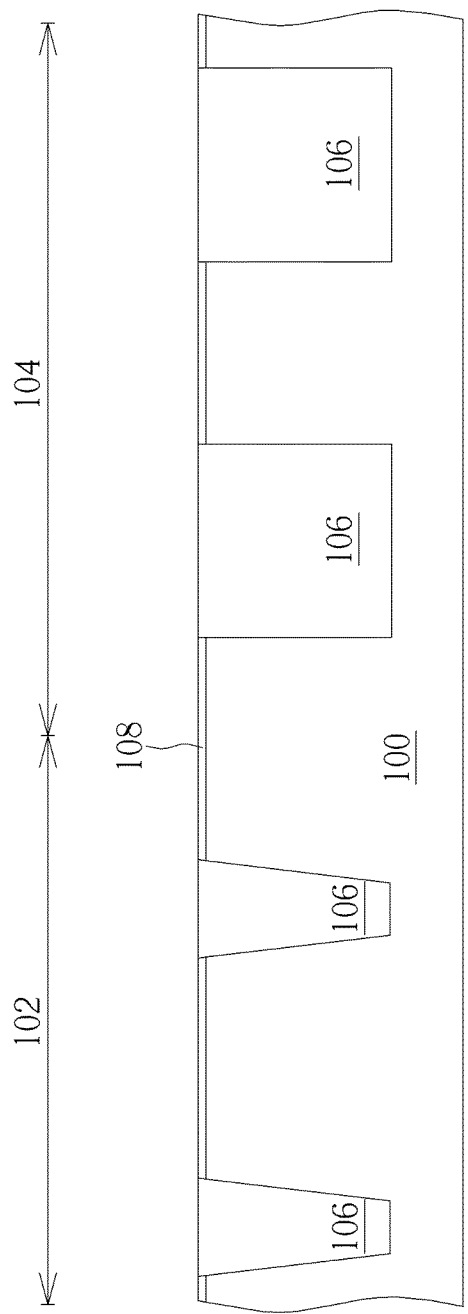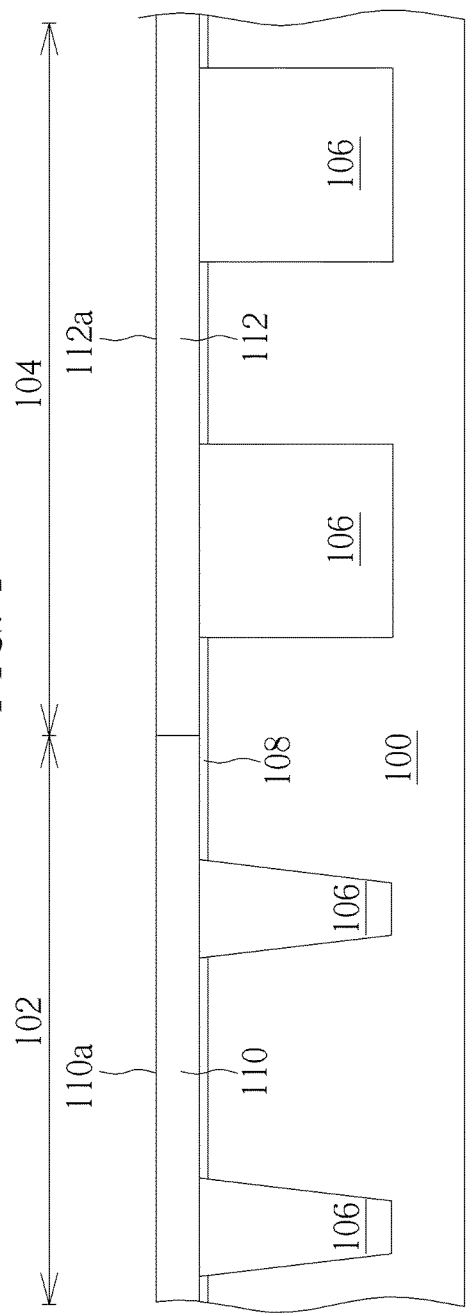

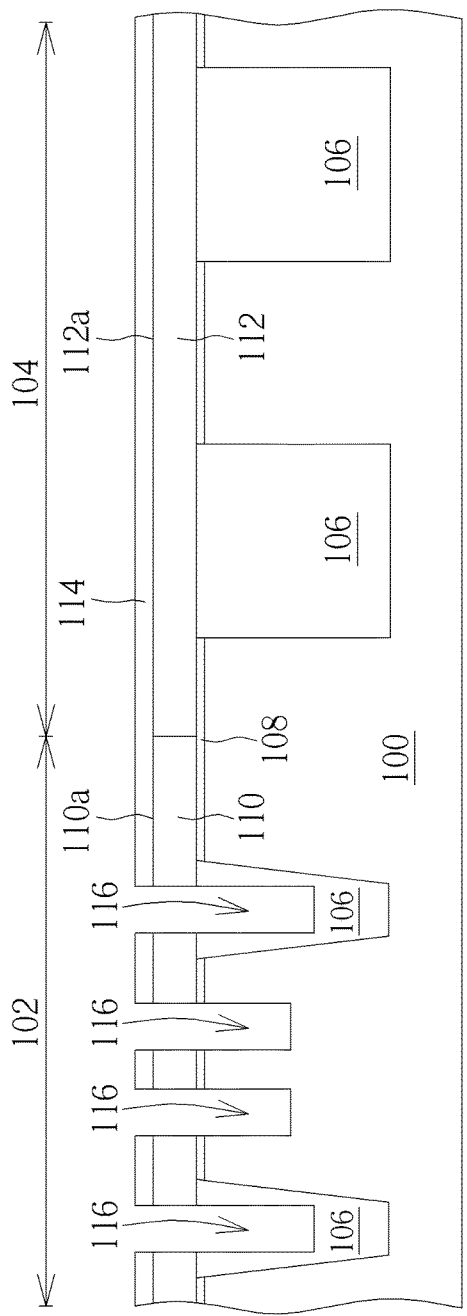
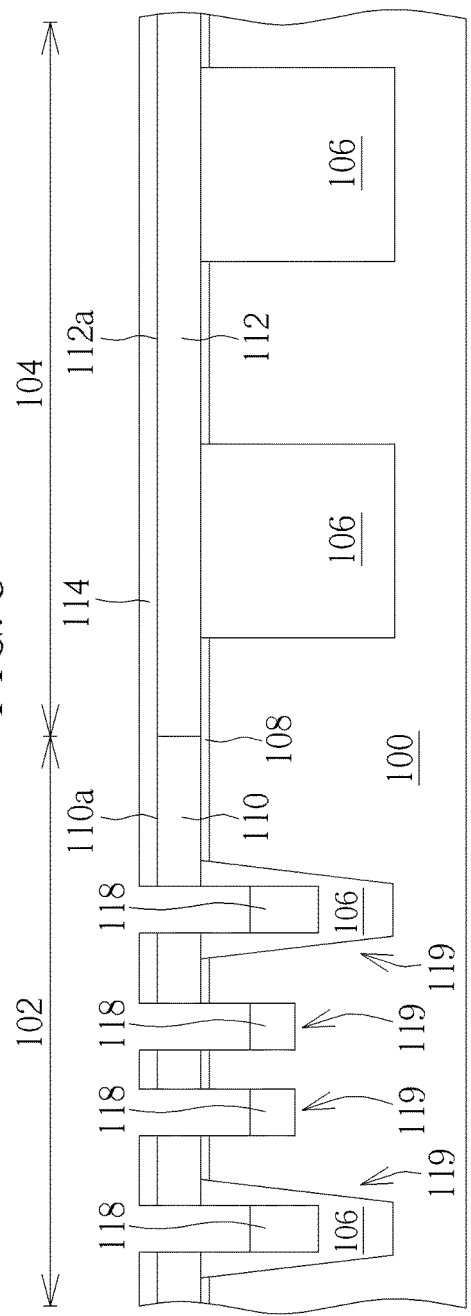

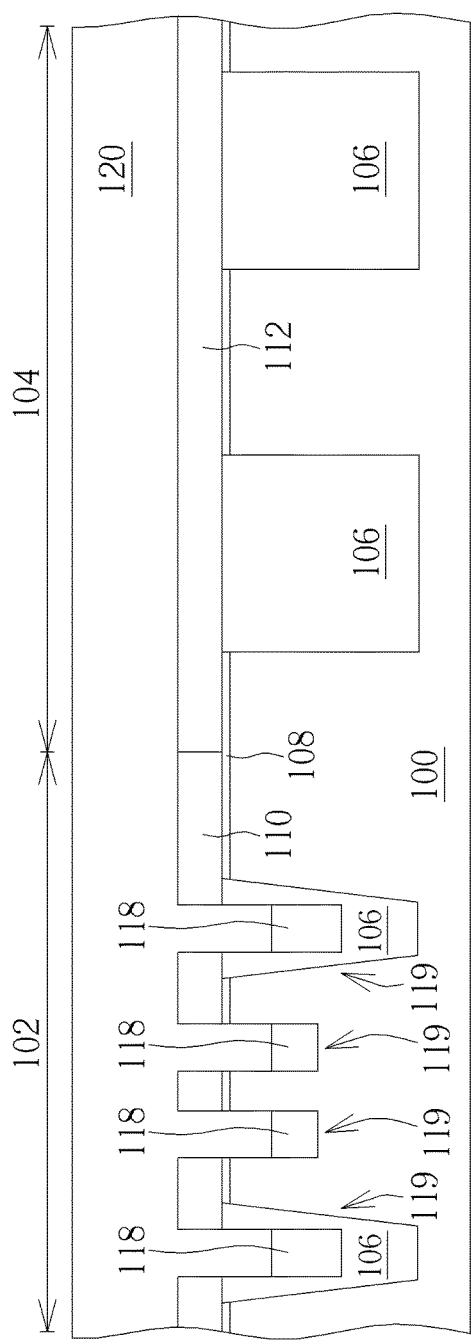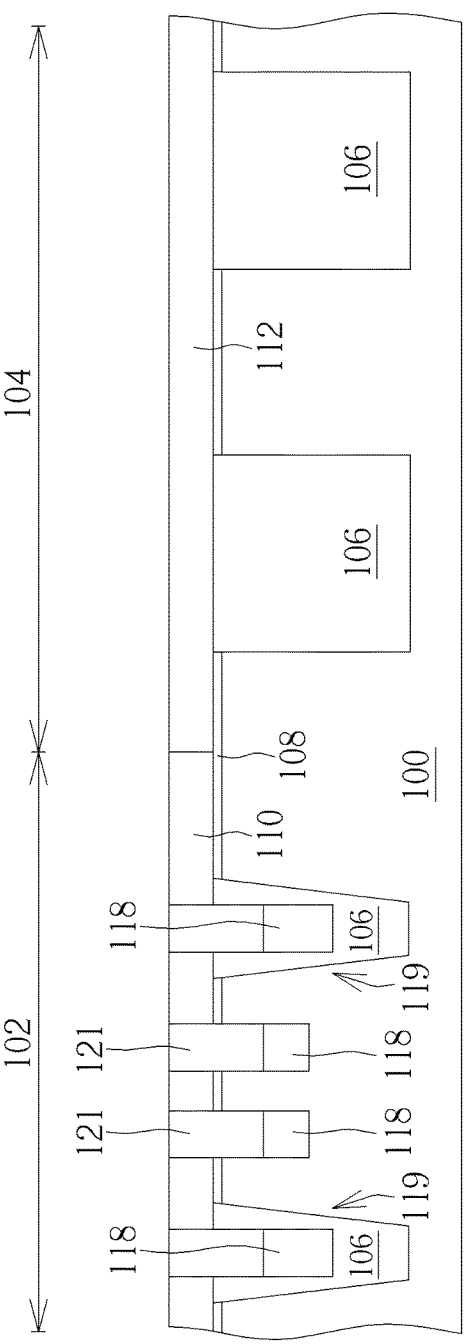

SEMICONDUCTOR DEVICE HAVING INSULATING LAYER HIGHER THAN A TOP SURFACE OF THE SUBSTRATE, AND METHOD FOR REDUCING THE DIFFICULTY OF FILLING AN INSULATING LAYER IN A RECESS

BACKGROUND OF THE INVENTION

1. Field of the Invention

The present invention relates to a semiconductor device and manufacturing methods thereof, and in particular, to a semiconductor memory device and manufacturing methods thereof.

2. Description of the Prior Art

Dynamic random access memory (hereinafter abbreviated as DRAM) is a volatile memory that commonly used as system memory. A memory cell array of DRAM has a configuration in which memory cells, each including an access metal oxide semiconductor (hereinafter abbreviated as MOS) transistor and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed). Therefore, one method in the semiconductor industry of overcoming the above problems is to form DRAM devices having stacked capacitors. These types of capacitors extend vertically upward over the MOS transistors. The two basic types of stacked capacitor DRAM cells of the prior art are the capacitor over bit line (hereinafter abbreviated as COB) and capacitor under bit line (CUB).

As memory cells of DRAM become more integrated and miniaturized, overlay margin between the contact plugs for providing electrical connection to the storage node and to the bit line is reduced. That is, a process issue is caused. Therefore DRAM designs for improving DRAM performance and method for improving process yield are still needed.

SUMMARY OF THE INVENTION

The present invention provides a semiconductor device, the semiconductor device includes a substrate, defining a memory cell region and a periphery region, a periphery gate stacking structure, disposed in the periphery region, wherein the periphery gate stacking structure at least includes a first gate layer, and a second gate layer disposed on the first gate layer, and a cell stacking structure, disposed in the memory cell region. The cell stacking structure at least comprising a first insulating layer, partially disposed in the substrate, a top surface of the first insulating layer being higher than a top surface of the substrate, and the top surface of the first insulating layer and a top surface of the first gate layer of the periphery gate stacking structure being on a same level.

The present invention further provides a method for forming a semiconductor device, at least comprising the following steps: firstly, a substrate is provided, defining a memory cell region and a periphery region, a gate oxide layer is formed on the substrate and within the memory cell region and the periphery region, after the gate oxide layer is formed, a periphery gate stacking structure is formed in the periphery region, wherein the periphery gate stacking structure at least includes a first gate layer, and a second gate layer disposed on the first gate layer, and after the gate oxide layer is formed, a cell stacking structure is formed in the memory cell region, the cell stacking structure at least comprising a first insulating layer, partially disposed in the substrate, a top surface of the first insulating layer being higher than a top surface of the substrate, and the top surface of the first insulating layer and a top surface of the first gate layer of the periphery gate stacking structure being on a same level.

The key feature of the present invention is to form the first insulating layer higher than the top surface of the substrate. In this way, it is possible to reduce the difficulty of subsequent filling of the insulating layer in the recess, and to improve the yield of the semiconductor device. Besides, the gate oxide layer is firstly formed within the periphery region, so after the bit lines are formed in the following steps, there is no need to form the gate oxide layer in the periphery region again, to avoid the bit lines being destroyed by the high temperature during the process for forming the gate oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 illustrate a forming method of a semiconductor device according to a first embodiment of the present invention, wherein:

FIG. 1 shows the schematic diagram of the semiconductor device, including an oxide dielectric layer formed on a substrate;

FIG. 2 shows the schematic diagram of the semiconductor device after an insulating layer and a first gate layer are formed;

FIG. 3 shows the schematic diagram of the semiconductor device after a plurality of recesses are formed in the substrate;

FIG. 4 shows the schematic diagram of the semiconductor device after the word line layer is formed in the recesses;

FIG. 5 shows the schematic diagram of the semiconductor device after an insulating layer is filled in each recess;

FIG. 6 shows the schematic diagram of the semiconductor device after a planarization process is performed;

FIG. 7 shows the schematic diagram of the semiconductor device after a bit line contact recess is formed;

FIG. 8 shows the schematic diagram of the semiconductor device after a second gate layer and a hard mask are formed;

FIG. 9 shows the schematic diagram of the semiconductor device after a patterning process is performed; and FIG. 10 shows the schematic diagram of the semiconductor device after a dielectric layer and a plurality of contact holes are formed.

DETAILED DESCRIPTION

Figure 7:
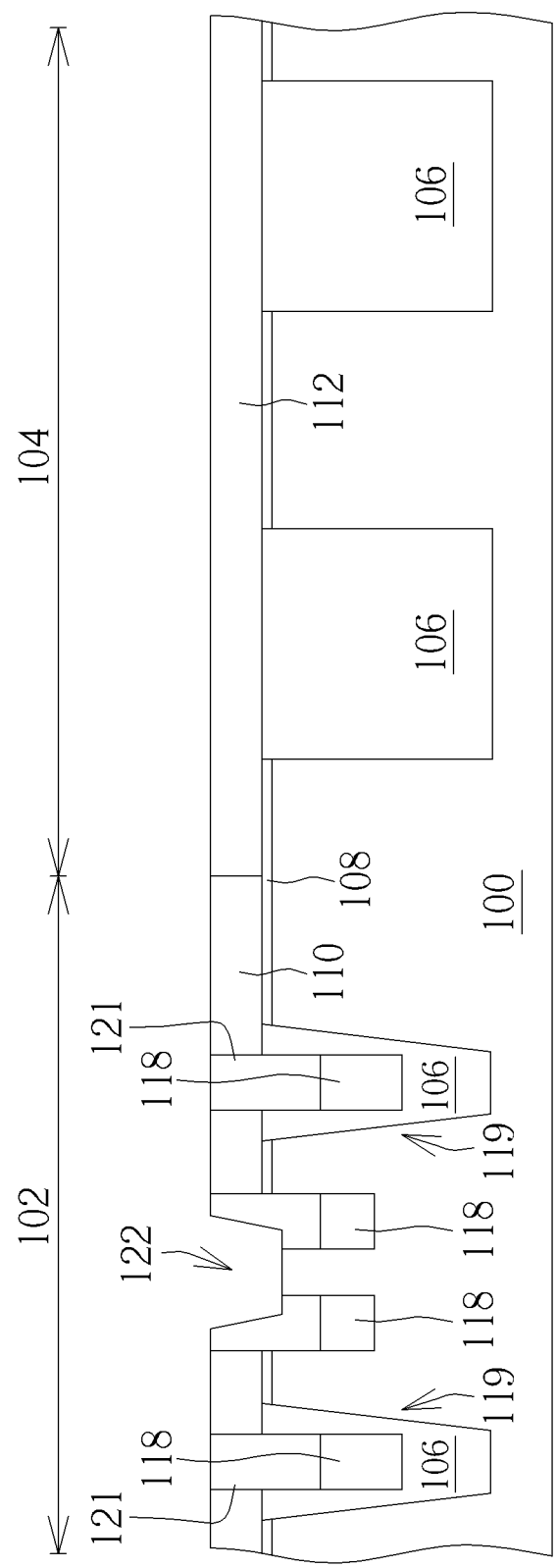

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Please refer to FIGS. 1-10, which illustrate a forming method of a semiconductor device according to a first embodiment of the present invention. As shown in FIG. 1, in the preferred embodiment of the present invention, one substrate 100 is provided, a memory cell region 102 and a periphery region 104 are defined on the substrate 100, the memory cell region 102 is the region which is predicted to form the memory devices such as dynamic random access memory (DRAM) therein, and the gate structures will be formed in the periphery region 104 in the following steps. In this embodiment, a plurality of shallow trench isolations (STI) structures 106 are formed in the memory cell region 102 and in the periphery region 104, to define a plurality of active regions which are used to accommodate the transistor devices, and to electrically isolate these active regions from each other.

Next, a gate oxide layer 108 is formed on the substrate 100 within the memory cell region 102 and within the periphery region 104. The gate oxide layer 108 is formed through a process such as a thermal oxidation process, so it may only be formed on the top surface of the substrate 100, but not be formed on the top surface of the STI 106. It is noteworthy that the process for forming the gate oxide layer 108 usually is accompanied with high temperature. In the present invention, the gate oxide layer 108 is firstly formed within the periphery region 104, so after the bit lines are formed in the following steps, there is no need to form the gate oxide layer in the periphery region 104 again, to avoid the bit lines being destroyed by the high temperature during the process for forming the gate oxide layer.

As shown in FIG. 2, the process uses deposition, lithography and etching steps, to form an insulating layer 110 in the memory cell region 102, and performs another deposition, lithography and etching steps, to form a first gate layer 112 in the periphery region 104, the material of the insulating layer 110 such as silicon oxide or silicon nitride, and the material of the first gate layer 112 preferably comprises silicon. In the present invention, the insulating layer 110 can be formed before or after the first gate layer 112 is formed, however, after both the insulating layer 110 and the first gate layer 112 are formed, a planarization process (not shown) will be performed, so a top surface 110a of the insulating layer 110 and a top surface 112a of the first gate layer 112 are on a same level. In addition, before the insulating layer 110 is formed, an ion implantation step may be performed, so as to form the implanted region in the memory cell region 102, which can be used as the source/drain regions or light doped drain (LDD) of the gate structures of the word lines formed in the following steps.

As shown in FIG. 3, a hard mask 114 can selectively be formed on the insulating layer 110 and on the first gate layer 112, where the material of the hard mask 114 and the material of the insulating layer 110 have different etching selectivity. For example, the materials of the hard mask 114 can be materials such as silicon nitride, silicon oxide, or silicon oxynitride, but not limited thereto. Afterwards, a plurality of recesses 116 are formed in the memory cell region 102, and penetrate parts of the substrate 100 and the STI 106.

As shown in FIG. 4, a word line layer 118 is filled in each recess 116 within the memory cell region 102, so as to form a plurality of the word lines 119. The word line layer 118 may be a multiple-layer structure, such as including at least one dielectric layer and a conductive layer. To simply the figure, the word line layer 118 is only shown as a single layer structure here.

Next, as shown in FIG. 5, an insulating layer 120 is formed in the memory cell region 102 and in the periphery region 104, the materials of the insulating layer 120 being materials such as silicon nitride or silicon oxide, but not limited thereto. The insulating layer 120 is disposed on the word line layer 118, and fills up each recess 116. Besides, the insulating layer 120 further covers on the insulating layer 110 and on the first gate layer 112. In addition, in this embodiment, the insulating layer 120 is formed after the hard mask 114 is removed entirely, but the present invention is not limited thereto. In other words, the hard mask 114 may still exist on the insulating layer 110 and on the first gate layer 112.

As shown in FIG. 6, a planarization process P1 is performed on the insulating layer 120, to remove the extra insulating layer 120 (or in another embodiment, if there still exists some hard mask 114, the remaining hard mask 114 will also be removed entirely during the planarization process P1), until a top surface 120a of the insulating layer 120 and a top surface 110 of the insulating layer 110 are on a same level. Here the remaining insulating layer 120 is defined as the first insulating layer 121, and each first insulating layer 121 is disposed on each word line 119. It is noteworthy that a top surface 120a of the first insulating layer 121 and a top surface 112a of the first gate layer 112 are on a same level too. Besides, the top surface 120a of the insulating layer 120 is higher than the top surface of the substrate 100.

As shown in FIG. 7, at least one recess 122 is formed in the memory cell region 102, disposed in parts of the insulating layer 110 and parts of the first insulating layer 121, and parts of the substrate 100 are exposed. The recess 122 is used to form the bit line contact, which is electrically connected the following-formed bit line and the doped regions of each transistor device. The characterization of the bit line contact structure is a well-known technique in the art and is not described here. Besides, in some embodiments, after the recess 122 is formed, a silicide layer (not shown) can be selectively formed in the recess 122 and on top surface of the first gate layer 112, and it should also be within the scope of the present invention.

Figure 8:
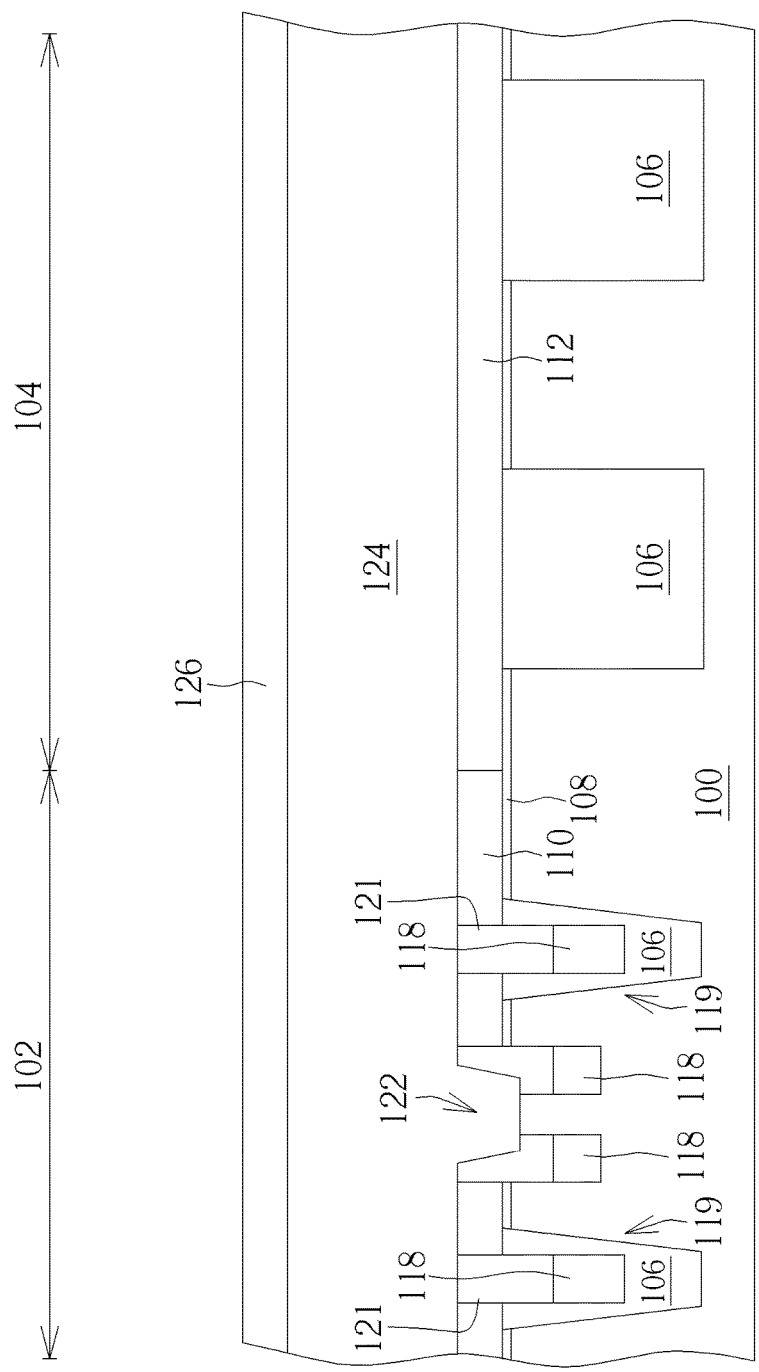
Figure 9:
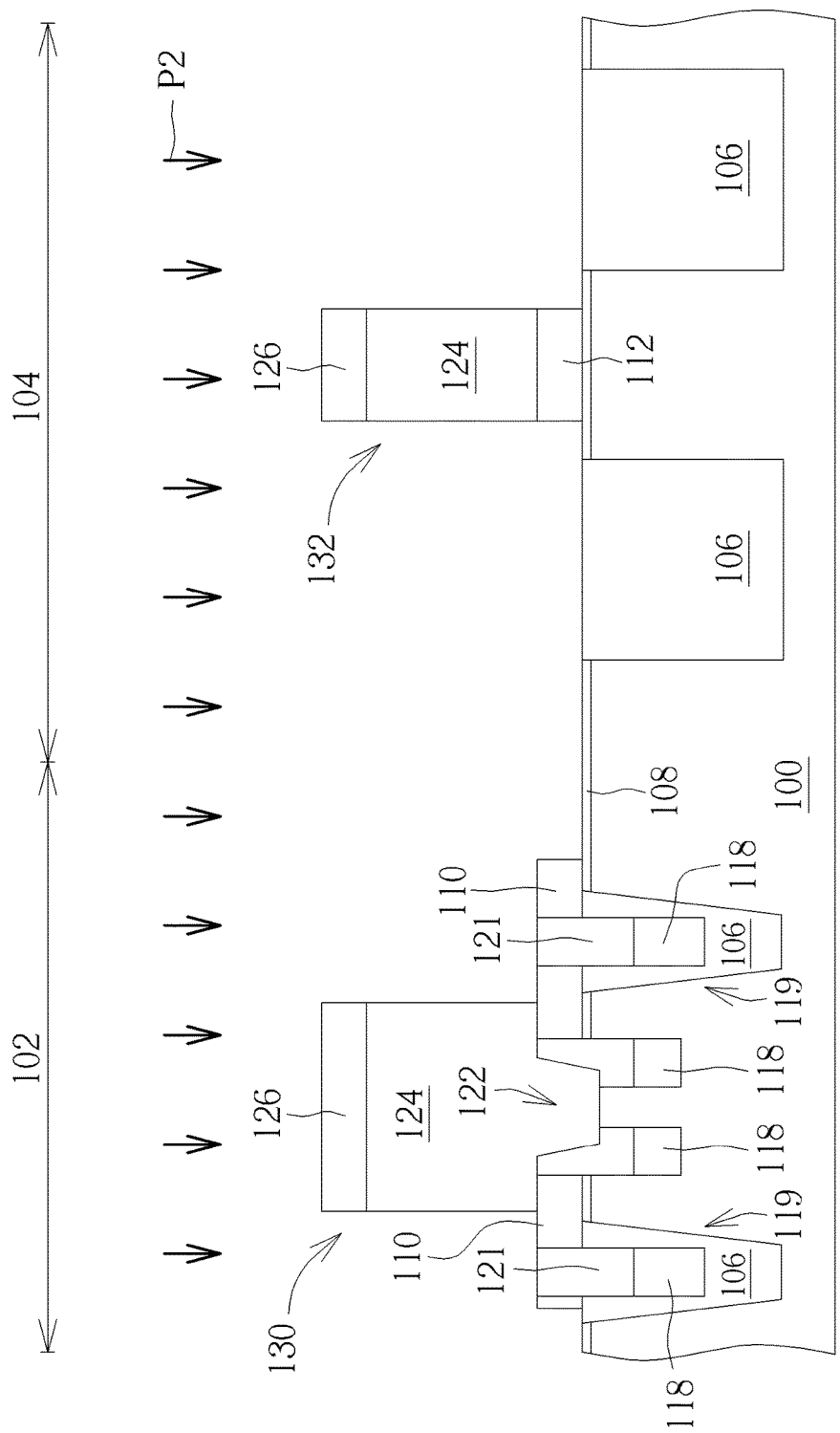

As shown in FIGS. 8-9, a second gate layer 124 is entirely formed in the memory cell region 102 and in the periphery region 104. The second gate layer 124 includes a conductive material of a single or composite layer, such as silicon (Si), titanium (Ti), titanium nitride (TiN), tungsten (WSi), tungsten nitride (WN), or tungsten (W), and the second gate layer 124 is at least filled in the recess 122, and directly contacts the substrate 100. A hard mask 126 is then formed on the second gate layer 124. Afterwards, as shown in FIG. 9, a patterning process P2 is performed, to remove the extra insulating layer 110, the second gate layer 124 and the hard mask 126, and to define the bit line structure 130 in the memory cell region 102 and the gate structure 132 in the periphery region 104.

Therefore, the structure of the semiconductor device of the present invention can be shown in FIG. 9. The semiconductor device includes a substrate 100, a defined memory cell region 102 and periphery region 104, a gate structure 132 disposed in the periphery region 104, wherein the gate structure 132 at least includes the first gate layer 112, and the second gate layer 124 disposed on the first gate layer 112, and a bit line structure 130, disposed in the memory cell region 102, the word line 119 at least including a first insulating layer 121, partially disposed in the substrate 100, the top surface 120a of the first insulating layer 121 being higher than the top surface of the substrate 100, and the top surface of the first insulating layer 121 and the top surface 112 of the first gate layer 112 of the gate structure 132 being on a same level. In addition, the second gate layer 124 acts as the main conductive part of the bit line structure 130, but only composes the upper conductive portion of the gate structure 132 (the lower conductive portion of the gate structure 132 includes the first gate layer 112).

Furthermore, as shown in FIG. 9, the semiconductor device of the present invention satisfies the following conditions: the top surface of the second gate layer 124 of the bit line structure 130 and the top surface of the second gate layer 124 of the gate structure 132 are on a same level; the hard mask 126 covers the bit line structure 130 and the gate structure 132 simultaneously; the insulating layer 110 is disposed between the first insulating layer 121 and the second gate layer 124; the gate oxide layer 108 is disposed between the insulating layer 110 and the substrate 100.

Figure 10:
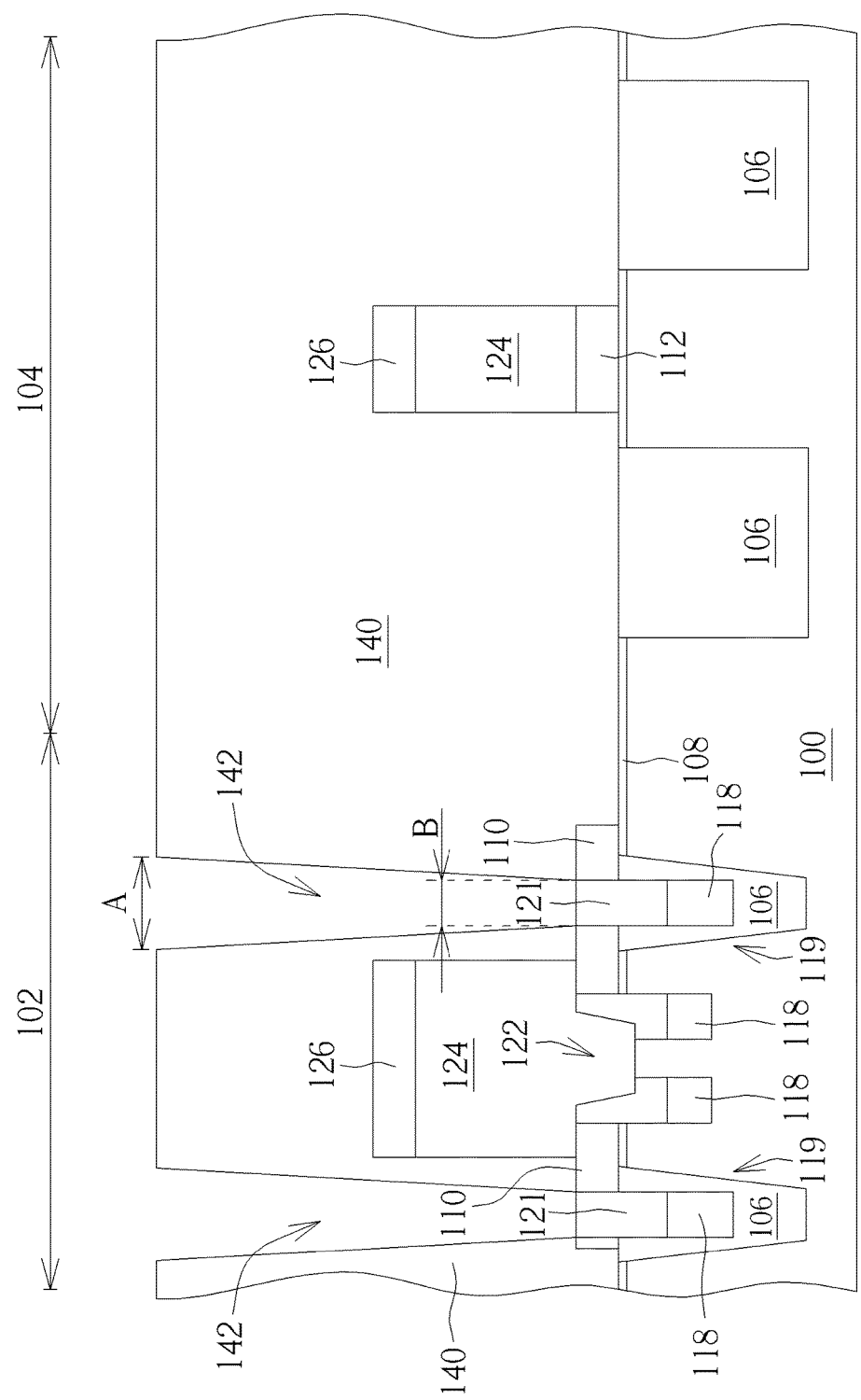

Please refer to FIG. 10, afterwards, a dielectric layer 140 is formed on the substrate 100, and a plurality of the recesses 142 are formed in the dielectric layer 140, the positions of parts of the recesses 142 corresponding to the positions of the word line 119. Each recess 142 shown in FIG. 10 is used to be filled by an insulating layer, and acts as the sidewall structure of the following-formed storage node contact (in the following steps, the dielectric layer 140 will be replaced by a conductive material layer, used as the conductive part of the storage node contact). The applicant found that the cross section of the recess 142 has a funnel shaped profile. In other words, the upper diameter A of the recess 142 is larger than the bottom diameter B of the recess 142. If the bottom diameter B of the recess 142 is too small, the insulating cannot fill up the recess 142 easily, and voids will be formed, which will affect the overall yield of semiconductor devices.

The key feature of the present invention can be shown in FIGS. 9-10, where after the bit line is completed, the first insulating layer 121 on the word lines 119 is higher than the top surface of the substrate 100. Therefore, the depth of each recess 142 is reduced, which will further increase the bottom diameter of the recess 142. For example, in one embodiment of the present invention, the upper diameter of the recess 142 is about 30 nanometers (nm), and the bottom diameter of the recess 142 is about 14.6 nm. However, in another embodiment of the present invention, if the top surface of the first insulating layer 121 is not higher than the top surface of the substrate 100 (such as being aligned with the top surface of the substrate 100), the upper diameter of the recess 142 is about 30 nanometers, but the bottom diameter of the recess 142 is only about 8.6 nm. Therefore, in this embodiment of the present invention, the bottom diameter is enlarged about 1.7 times, while the upper diameter is not changed. In other words, by forming the first insulating layer 121 higher than the top surface of the substrate, it is possible to reduce the difficulty of subsequent filling of the insulating layer in the recess 142, and to improve the yield of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, defining a memory cell region and a periphery region;
   a periphery gate stacking structure, disposed in the periphery region, wherein the periphery gate stacking structure at least includes a first gate layer, and a second gate layer disposed on the first gate layer; and
   a cell stacking structure, disposed in the memory cell region, the cell stacking structure comprising at least a first insulating layer, partially disposed in the substrate, a top surface of the first insulating layer being higher than a top surface of the substrate, and the top surface of the first insulating layer and a top surface of the first gate layer of the periphery gate stacking structure being on a same level.

2. The semiconductor device of claim 1, further comprising a third gate layer disposed on the first insulating layer of the cell stacking structure.

3. The semiconductor device of claim 2, wherein the third gate layer and the second gate layer comprise a same material.

4. The semiconductor device of claim 2, wherein a top surface of the third gate layer and a top surface of the second gate layer are on a same level.

5. The semiconductor device of claim 2, further comprising a second insulating layer disposed on the substrate, and disposed between the first insulating layer and the third gate layer.

6. The semiconductor device of claim 5, wherein the top surface of the first insulating layer and a top surface of the second insulating layer are on a same level.

7. The semiconductor device of claim 5, further comprising at least one recess disposed in the first insulating layer and the second insulating layer, and parts of the third gate layer being filled in each recess of the at least one recess and directly contacting the substrate.

8. The semiconductor device of claim 1, further comprising at least two hard masks, disposed on the second gate layer of the periphery gate stacking structure, and on the third gate layer of the cell stacking structure respectively.

9. The semiconductor device of claim 5, further comprising a plurality of buried word lines disposed within the memory cell region.

10. The semiconductor device of claim 5, further comprising a gate oxide layer, disposed between second insulating layer and the substrate, and disposed between the first gate layer and the substrate.

11. A method for forming a semiconductor device, comprising at least the following steps:

providing a substrate, defining a memory cell region and a periphery region;

forming a gate oxide layer on the substrate and within the memory cell region and the periphery region;

after the gate oxide layer is formed, forming a periphery gate stacking structure in the periphery region, wherein the periphery gate stacking structure includes at least a first gate layer, and a second gate layer disposed on the first gate layer; and after the gate oxide layer is formed, forming a cell stacking structure in the memory cell region, the cell stacking structure comprising at least a first insulating layer, partially disposed in the substrate, a top surface of the first insulating layer being higher than a top surface of the substrate, and the top surface of the first insulating layer and a top surface of the first gate layer of the periphery gate stacking structure being on a same level.

12. The method of claim 11, further comprising forming a third gate layer on the first insulating layer of the cell stacking structure.

13. The method of claim 12, wherein the third gate layer and the second gate layer comprise a same material.

14. The method of claim 12, wherein a top surface of the third gate layer and a top surface of the second gate layer are on a same level.

15. The method of claim 12, further comprising forming at least two hard masks on the second gate layer of the periphery gate stacking structure and on the third gate layer of the cell stacking structure respectively.

16. The method of claim 12, further comprising forming a second insulating layer on the gate oxide layer, and disposed between the first insulating layer and the third gate layer.

17. The method of claim 13, further comprising forming at least one recess in the first insulating layer and the second insulating layer, and parts of the third gate layer being filled in each recess of the at least one recess and directly contacting the substrate.

18. The method of claim 11, further comprising forming a plurality of buried word lines within the memory cell region.

19. The method of claim 18, wherein the first gate layer of the periphery gate stacking structure is formed before the plurality of buried word lines are formed.

20. The method of claim 18, wherein the second gate layer of the periphery gate stacking structure is formed after the plurality of buried word lines are formed.

* * * * *